(12) United States Patent
Basudhar

(10) Patent No.: US 9,117,042 B2
(45) Date of Patent: Aug. 25, 2015

(54) SYSTEMS AND METHODS OF USING MULTIPLE SURROGATE-BASED PARAMETER SELECTION OF ANISOTROPIC KERNELS IN ENGINEERING DESIGN OPTIMIZATION

(71) Applicant: Livermore Software Technology Corporation, Livermore, CA (US)

(72) Inventor: Anirban Basudhar, Livermore, CA (US)

(73) Assignee: Livermore Software Technology Corp., Livermore, CA (US)

( * ) Notice: Subject to any disclaimer, the term of this patent is extended or adjusted under 35 U.S.C. 154(b) by 548 days.

(21) Appl. No.: 13/677,869

(22) Filed: Nov. 15, 2012

(65) Prior Publication Data
US 2013/0204585 A1   Aug. 8, 2013

Related U.S. Application Data

(60) Provisional application No. 61/595,669, filed on Feb. 6, 2012.

(51) Int. Cl.
G06N 5/04 (2006.01)
G06F 17/50 (2006.01)

(52) U.S. Cl.
CPC ........ *G06F 17/5018* (2013.01); *G06F 17/5095* (2013.01); *G06N 5/04* (2013.01)

(58) Field of Classification Search
None
See application file for complete search history.

(56) References Cited

PUBLICATIONS

Plevris, Innovative Computational Techniques for the Optimum Structural Design Considering Uncertainties, Doctoral Thesis, National Technical University of Athens, Jun. 2009, pp. 1-346.*
Debnath et al. "An Efficient Method for Tuning Kernel Parameter of the Support Vector Machine", International Symposium on Communications and Information Technologies 2004, pp. 1023-1028.
Yu et al. "Reconstructing Surfaces of Particle-Based Fluids Using Anisotropic Kernels", Eurographics/ ACM Siggraph Symposium on Computer Animation 2010.
Darko Brodic "Optimization of the Anisotropic Gaussian Kernel for Text Segmentation and Parameter Extraction", TCS 2010 International Federation for Information Processing pp. 140-152.
Shamsheyeva et al. "The anisotropic Gaussian kernel for SVM classification of HRCT images of the lung", Issnip 2004, IEEE pp. 439-444.

* cited by examiner

*Primary Examiner* — Wilbert L Starks
(74) *Attorney, Agent, or Firm* — Roger H. Chu

(57) ABSTRACT

Methods of conducting design optimization of a product using multiple metamodels are described. First and the second metamodels are configured with common kernel function. Kernel width parameter is the output or result of the first metamodel while the second metamodel requires a set of substantially similar kernel width parameters defined a priori. Further, the second metamodel is configured with an anisotropic kernel. First and second metamodels are trained in two stages. In the first stage, kernel width parameters are obtained by fitting known responses (obtained in numerical simulations) into the first metamodel with one or more prediction trends. Additional kernel width parameter set is derived by algebraically combining the obtained kernel width parameters. The second metamodel is then trained by cross-validating with known responses using N trial sets of metamodel parameter values including the kernel width parameter values determined in the first stage along with various combinations of other parameters.

13 Claims, 6 Drawing Sheets

SYSTEMS AND METHODS OF USING MULTIPLE SURROGATE-BASED PARAMETER SELECTION OF ANISOTROPIC KERNELS IN ENGINEERING DESIGN OPTIMIZATION

FIELD OF THE INVENTION

The present invention generally relates to engineering design optimization, more particularly to practical methods of using multiple surrogate-based parameter selection of anisotropic kernels (e.g. anisotropic Gaussian kernel) in engineering design optimization of a product.

BACKGROUND OF THE INVENTION

Today, computer aided engineering (CAE) has been used for supporting engineers in tasks such as analysis, simulation, design, manufacturing, etc. In a conventional engineering design procedure, CAE analysis (e.g., finite element analysis (FEA), finite difference analysis, meshless analysis, computational fluid dynamics (CFD) analysis, modal analysis for reducing noise-vibration-harshness, etc.) has been employed to evaluate responses (e.g., stresses, displacements, etc.). Using automobile design as an example, a particular version or design of a car is analyzed using FEA to obtain the responses due to certain loading conditions. Engineers will then try to improve the car design by modifying certain parameters or design variables (e.g., thickness of the steel shell, locations of the frames, etc.) based on specific objectives and constraints. Another FEA is conducted to reflect these changes until a "best" design has been achieved. However, this approach generally depends on knowledge of the users (i.e., engineers or scientists) or based on a trial-or-error method.

Furthermore, very often in any engineering problems or projects, these design variables, objectives and constraints are in conflict and interact with each other nonlinearly. Thus, it is not very clear how to modify them to achieve the "best" design or trade-off. This situation becomes even more complex in a multi-disciplinary optimization that has a set of conflicting objectives. To solve this problem, a systematic approach to identify the "best" design, referred to as design optimization, is used.

In conventional design optimization, a set of design variables, objectives and constraints is defined first. A large number of sample design variations (i.e., samples) are then chosen in the design space defined by the design variables. Each design variable represents one of the design space's dimensions. Therefore a design space for more than three design variables is a hypervolume. The responses of the chosen samples are obtained from physical experiments or computer simulations (e.g., FEA, CFD, etc.). The best design or designs are selected from the chosen samples based on the responses subject to design objectives and constraints.

This approach would work if the product is relatively simple. When the product becomes more complex, for example, an automobile, a single crashworthiness analysis may require many hours if not days of computation time even with a state-of-the-art multi-processor computer system. Long computing time and the associated costs render this approach unviable.

To overcome this shortcoming, metamodels or surrogate models are developed and used to replace some of the time consuming computer simulations and/or physical experiments, thereby reducing costs. Metamodels generally contain a correlation or kernel function in forms of mathematical equations that can be calibrated or trained to approximate responses. As a result of using metamodels, conduction of computer simulations is required only at relatively few samples. Responses of any other design variations can be approximated using metamodels.

One important aspect of using a metamodel is to ensure the accuracy of the approximated responses from the metamodel. The accuracy depends upon several factors. One of these factors is to choose a reasonable set of parameters for the kernel function. For certain types of metamodels, choosing a set of parameters is not trivial. In general, a training process must be performed to validate a metamodel with known responses, which generally are available at very few samples (i.e., design of experiment points) due in-part to the costs. For certain metamodels, kernel width parameters (e.g. spread values or standard deviations) must be specified a priori. If there are too many kernel width parameters, the training process would become very tedious and expensive, thereby not being viable in real world applications such as an automobile design in automotive industry. For at least this reason, prior art approaches at best use a simpler form of kernel function (e.g., isotropic Gaussian kernel). In other words, parameter of the kernel function is the same for all design variables. However, being a more general basis function, an anisotropic kernel is capable of providing better approximations compared to the corresponding isotropic kernel. This is especially the case when the sensitivity of the response is significantly different from one variable to another. Therefore, in order to improve accuracy, anisotropic kernel function needs to be used in such instances. In other words, each design variable is assigned its own parameter.

If a conventional cross-validation approach with a full grid of all the parameter values is used for selecting anisotropic kernel parameters then the cost will be too high. As each variable has an associated parameter, the number of parameters will increase with dimensionality. The number of possible parameter combinations will therefore increase exponentially. For example, in an optimization using six (6) design variables, the training effort is in the order of $(N_\sigma^6)$, where $N_\sigma$ is the possible number of width parameter values for each variable. (i.e., the kernel width parameter for each design variable in anisotropic kernel can take any of the $N_\sigma$ values).

Therefore, it would be desirable to have an efficient and effective approach to select parameters of anisotropic kernel function of metamodels in engineering design optimization.

BRIEF SUMMARY OF THE INVENTION

This section is for the purpose of summarizing some aspects of the present invention and to briefly introduce some preferred embodiments. Simplifications or omissions in this section as well as in the abstract and the title herein may be made to avoid obscuring the purpose of the section. Such simplifications or omissions are not intended to limit the scope of the present invention.

Systems and methods of using multiple surrogate-based parameter selection of the anisotropic kernel in engineering design optimization are disclosed. The present invention is of particular interest in a multiple surrogate framework, as several parameter values are obtained with negligible additional effort. This allows the use of metamodels using the more flexible anisotropic kernel for multiple surrogate prediction.

According to one aspect of the present invention, an engineering design optimization of a product is performed using multiple metamodels (i.e., first and second metamodels). The first and the second metamodels are configured with a common kernel function (e.g., anisotropic Gaussian kernel function). Kernel width parameters (e.g., spread or standard deviation) are the output or result of the first metamodel while the second metamodel requires a set of substantially similar parameters defined a priori. Further, the second metamodel is configured with an anisotropic kernel. An exemplary first metamodel comprises Kriging model. Exemplary second metamodels include, but are not necessarily limited to, support vector regression (SVR), radial basis function (RBF) networks.

According to another aspect, a set of design variables, objective(s) and constraint(s) for optimizing and designing a product is defined and received in a computer system. The design variables define a design space with one design variable per dimension. A number of design of experiments (DOE) samples are then chosen from the design space. Numerically-simulated responses are obtained by conducting a computer aided engineering (CAE) analysis (e.g., FEA, CFD, etc.) for each DOE sample.

These responses are then used for training first and second metamodels in two stages of a metamodel training procedure. The first stage training is conducted by fitting the known responses (i.e., numerically-simulated responses) into the first metamodel with one or more prediction trends. As a result, one or more sets of kernel width parameter values are obtained each from a respective prediction trend. Additional kernel width parameter set(s) can be derived by algebraically combining these obtained kernel width parameters. Finally, an optional kernel width parameter is obtained by assuming an isotropic kernel in the second metamodel (i.e., prior art approach).

Then the second stage of the training is performed as follows: 1) establishing N trial sets of metamodel parameter values by including the kernel width parameter values determined in the first stage of the training in various combinations of other parameters of the second metamodel; 2) partitioning the DOE samples into K groups without any overlapped DOE sample; 3) evaluating error of one of the N trial sets by comparing the approximated responses with the known responses, whereby the numerically-simulated responses are said training's target; and 4) repeating said evaluating error step for remaining of the N trial sets for said one of the K groups and then repeating for each of the N trial sets for all of the remaining ones among the K groups. The set having the minimum error is selected as the best metamodel parameter set for the trained second metamodel. N and K are strictly positive integers.

Using a metamodel having anisotropic kernel function allows the use of different kernel width parameters for the different design variables (sometime referred to as dimensions), thus making the approximation more flexible. Using kernel width parameter values obtained from a first metamodel in a second metamodel makes using anisotropic kernel viable, as it avoids the exponential rise in the training time with an increase in the number of variables.

Objects, features, and advantages of the present invention will become apparent upon examining the following detailed description of an embodiment thereof, taken in conjunction with the attached drawings.

BRIEF DESCRIPTION OF THE DRAWINGS

These and other features, aspects, and advantages of the present invention will be better understood with regard to the following description, appended claims, and accompanying drawings as follows:

DETAILED DESCRIPTION

In the following description, numerous specific details are set forth in order to provide a thorough understanding of the present invention. However, it will become obvious to those skilled in the art that the present invention may be practiced without these specific details. The descriptions and representations herein are the common means used by those experienced or skilled in the art to most effectively convey the substance of their work to others skilled in the art. In other instances, well-known methods, procedures, and components have not been described in detail to avoid unnecessarily obscuring aspects of the present invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams representing one or more embodiments of the invention do not inherently indicate any particular order nor imply any limitations in the invention.

Embodiments of the present invention are discussed herein with reference to FIGS. 1-5. However, those skilled in the art will readily appreciate that the detailed description given herein with respect to these figures is for explanatory purposes as the invention extends beyond these limited embodiments.

Figure 2A:
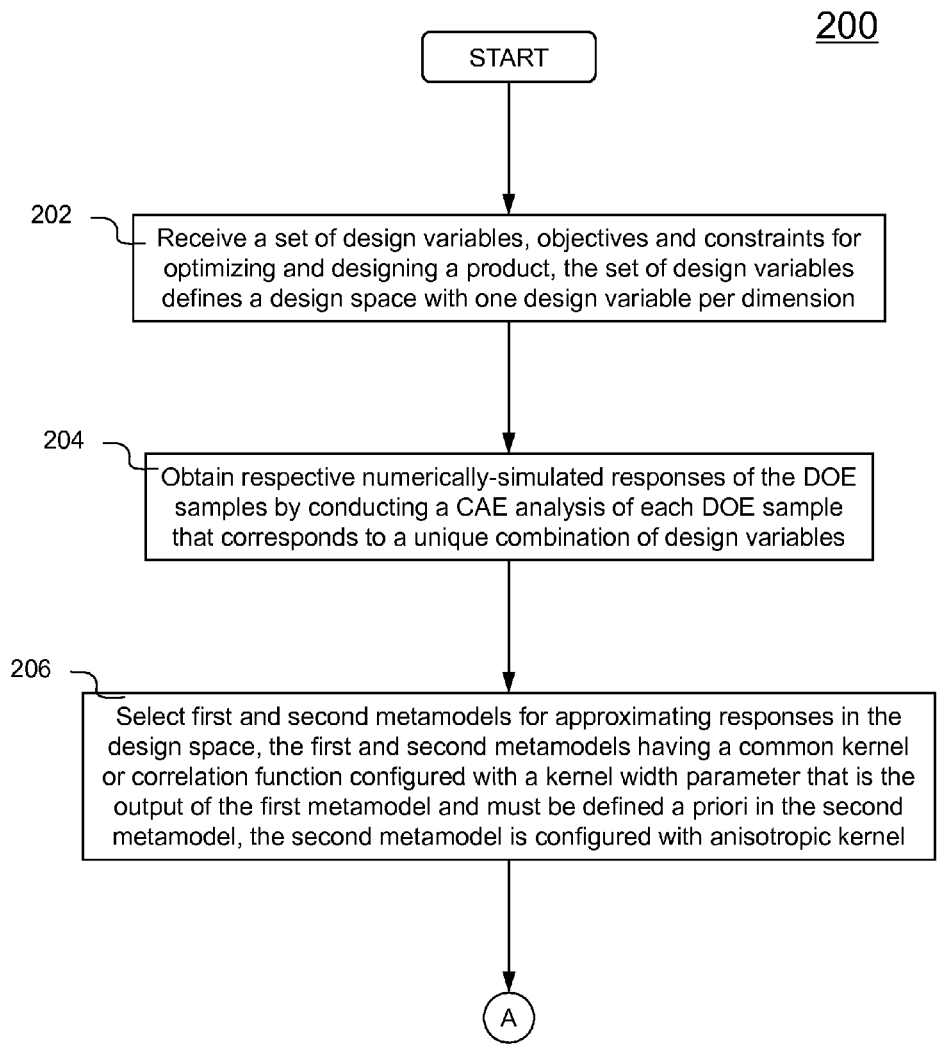
FIGS. 2A-2B collectively is a flowchart illustrating an exemplary process of conducting an engineering design optimization of a product using multiple metamodels, according to an embodiment of the present invention.
Figure 2B:
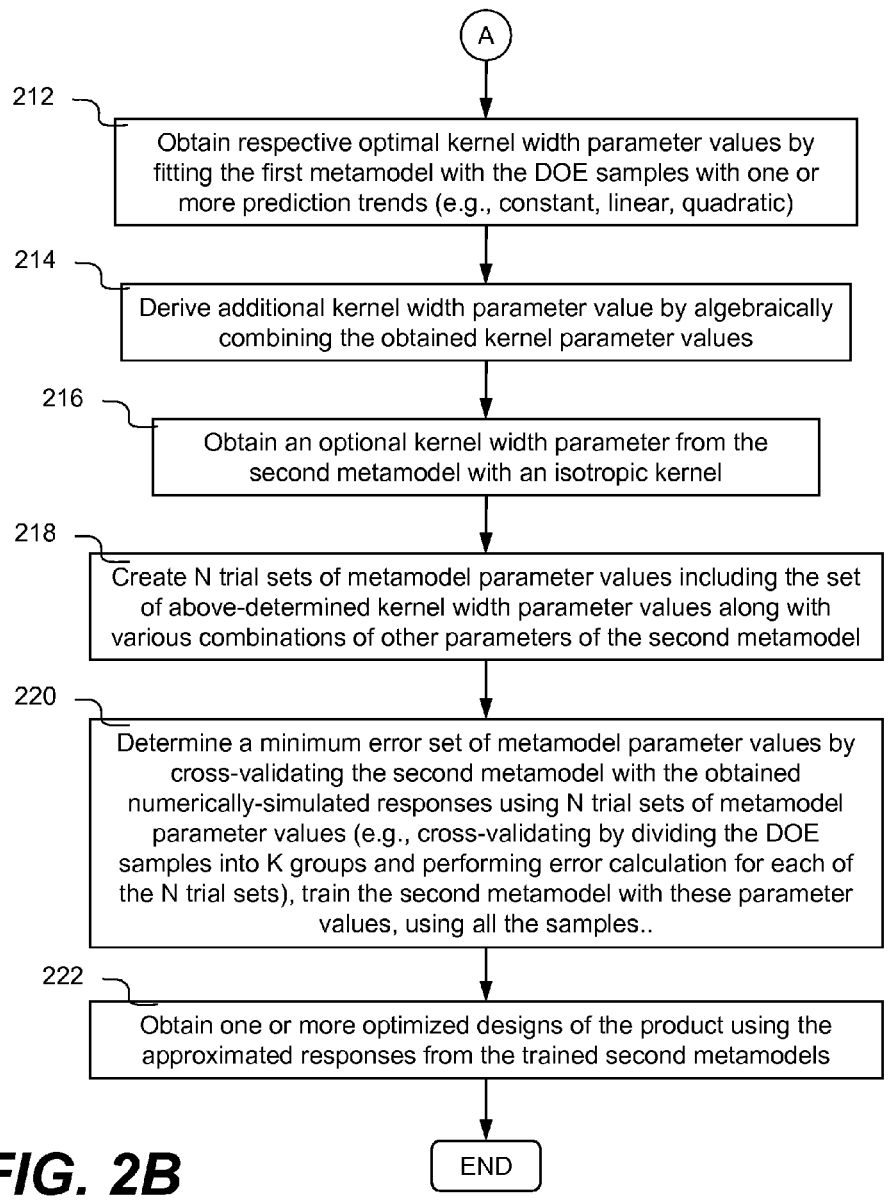

Referring first to FIGS. 2A-2B, there are collectively shown a flowchart illustrating an exemplary process 200 of conducting an engineering design optimization of a product using multiple metamodels, according to an embodiment of the present invention. Process 200 is implemented in software and preferably understood with other figures.

Process 200 starts by receiving a set of design variables, objectives and constraints for optimizing and designing a product in a computer system (e.g., computer system 100) at step 202. An engineering design optimization software (i.e., application module) is installed on the computer system.

Figure 3:
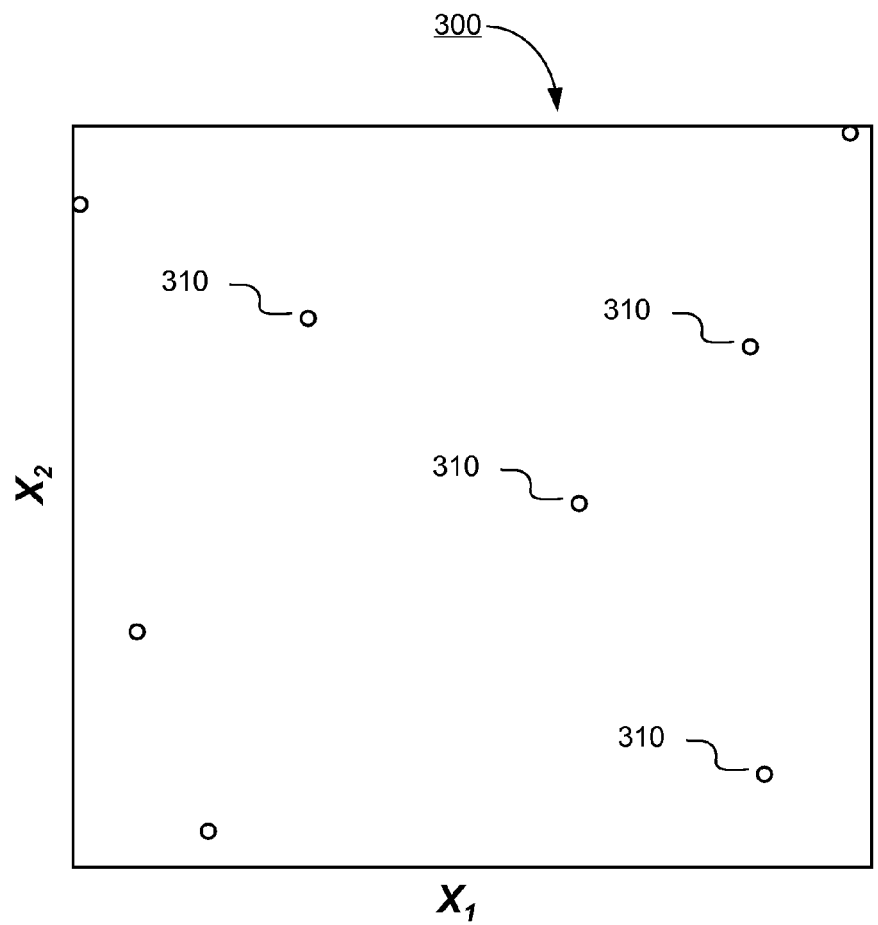
FIG. 3 is a two-dimensional diagram illustrating DOE samples in a design space, according to an embodiment of the present invention.

At step 204, a number of design of experiments (DOE) samples are chosen from the design space, which is defined by the design variables with one design variable per dimension. Shown in FIG. 3 is an exemplary two-dimensional design space 300 having two design variables ($X_1$, $X_2$). DOE samples 310 are illustrated as circles in the design space 300. Numerically-simulated responses of these chosen DOE samples are obtained by conducting a CAE analysis (e.g., finite element analysis) in a computer system having an application module installed thereon.

There are many known procedures for choosing DOE samples. The present invention applies to any and every of the selection procedures. Each DOE sample is a unique combination of design variables that represents a particular design variation of the product.

Next, at step 206, multiple metamodels (i.e., first and second metamodels) are selected for approximating responses in the design space. The intention for using these metamodels is to reduce further CAE analyses. Both the first metamodel and the second metamodel have a common correlation kernel function with a set of kernel width parameters, which is the output of the first metamodel and is defined a priori in the second metamodel. Exemplary first metamodel is a Kriging model and exemplary second metamodel is a support vector regression (SVR) model. Formula for these two models are summarized below.

Kriging Model

Kriging model is based on a random process:

$$\hat{f}(x) = h(x)^T \beta + Z(x) \quad (1)$$

where h is the trend of the model, $\beta$ is the vector of trend coefficients, and Z is a stationary Gaussian process based on correlation between samples.

The covariance between any two samples a and b is defined as:

$$\text{cov}[Z(a), Z(b)] = \sigma_z^2 R(a,b) \quad (2)$$

where $\sigma_z^2$ is the variance of the process Z, and R is the correlation function:

$$R(a,b) = e^{-\Sigma_{j=1}^m \theta_j |a_j - b_j|^{p_j}} \quad (3)$$

where $\theta_j$ is the scale or kernel width parameter for the j-th dimension and the parameter $p_j$ determines the smoothness of the correlation function and is set to 2 for Gaussian correlation.

The regression term in Equation (1) can have several forms. Some of the commonly used trends are constant, linear and quadratic. The expected valued ($\mu_f$) and variance ($\sigma_f^2$) of the Kriging prediction are:

$$\mu_f(x) = h(x)^T \beta + r(x)^T R^{-1}(y - F\beta) \quad (4)$$

$$\sigma_f^2(x) = \sigma_z^2 [h(x)^T r(x)^T] \begin{bmatrix} 0 & F^T \\ F & R \end{bmatrix}^{-1} \begin{bmatrix} h(x) \\ r(x) \end{bmatrix} \quad (5)$$

where r is the array of correlation between the prediction point and the training samples, R is the matrix of pair-wise correlation between the training samples, F is the matrix with rows $h(x_i)$ calculated at the training samples, and y is the vector of known responses (e.g., numerically-simulated responses from CAE) at the training samples. The unknowns $\beta$, $\sigma_z^2$ and $\theta_j$ are obtained using maximum likelihood.

SVR Model

SVR approximation is given as:

$$f(x) = b + \sum_{i=1}^{N} (\lambda_i - \lambda_i^*) y_i K(x_i, x) \quad (6)$$

where $y_i$ is the actual or known response value at the $i^{th}$ training sample, $\lambda_i$ and $\lambda_i^*$ are Lagrange Multipliers obtained during the SVR solution process, K is the kernel function (substantially similar to the correlation function in Kriging).

Some of the commonly used kernels are polynomials and Gaussian radial basis function, more specifically, the isotropic Gaussian radial bases function as follows:

$$K(x_i, x) = \exp\left(-\frac{\|x_i - x\|^2}{2\sigma^2}\right) \quad (7)$$

where $\sigma$ is the kernel width parameter of the Gaussian kernel that needs to be predefined.

A more general and flexible kernel function is anisotropic Gaussian kernel function as follows:

$$K(x_i, x) = \exp\left(-\sum_{i=1}^{d} \frac{\|x_j - x_{ij}\|^2}{2\sigma_j^2}\right) \quad (8)$$

where d is number of design variables or dimensions and $\sigma_j^2$ is the spread parameter (i.e., kernel width parameter) for $j^{th}$ design variable.

In additional to the kernel width parameter $\sigma$, SVR has two other parameters: penalty parameter C and noise parameter $\epsilon$. Traditionally, these three metamodel parameter values are selected using cross-validation (CV) scheme. In case of isotropic kernel, a three-dimensional grid of metamodel parameter values is used in CV. CV becomes infeasible for high dimensional problems when anisotropic kernel function is used because the number of metamodel parameters in the grid is a function to the power of the dimension (i.e., design variables).

Referring now to FIG. 2B, first and the second metamodels need to be trained such that the approximated responses from the trained second metamodel can best represent the numerically-simulated responses obtained from CAE analysis. According to one aspect of the present invention, the metamodel training procedure is conducted in two stages. In the first stage (i.e., steps 212-216), the first metamodel is trained to obtain a number of kernel width parameter values, which is used in the second stage (i.e., steps 218-220) for training the second metamodel. As a result, a set of metamodel parameter values is determined to be used in the trained second metamodel.

At step 212, by fitting the known responses (i.e., the numerically-simulated responses obtained from conducting the CAE analysis for the DOE samples) into the first metamodel with one or more prediction trends (e.g., constant, linear, quadratic, etc.), corresponding one or more kernel width parameter values are obtained. Then at step 214, addition kernel width parameter value can be derived by algebraically combining the obtained kernel width parameter values from step 212.

In addition to those from steps 212-214, an optional kernel width parameter value is obtained by assuming an isotropic kernel for the second metamodel at step 216. Including the optional kernel width parameter is to ensure the training effort cannot be worse than the prior art approaches according to an embodiment of the present invention.

After the first stage of training has completed, at step 218, N trial sets of metamodel parameter values are created by including the kernel width parameter values determined in the first stage of the training along with various combinations of other parameters (e.g., penalty parameter C and noise parameter $\epsilon$ of SVR) of the second metamodel. N is a positive integer.

Next, at step 220, a minimum error set of metamodel parameter values is determined from the N trial sets by training the second metamodel (e.g., cross-validating with the known responses of the DOE samples). Then the minimum error set is selected for training the second metamodel. Finally, at step 222, one or more optimized designs of the product using approximated responses predicted from the trained second metamodel are obtained. The product may include, but is not limited to, automobile, airplane, and the likes. Process 100 ends thereafter.

Figure 4:
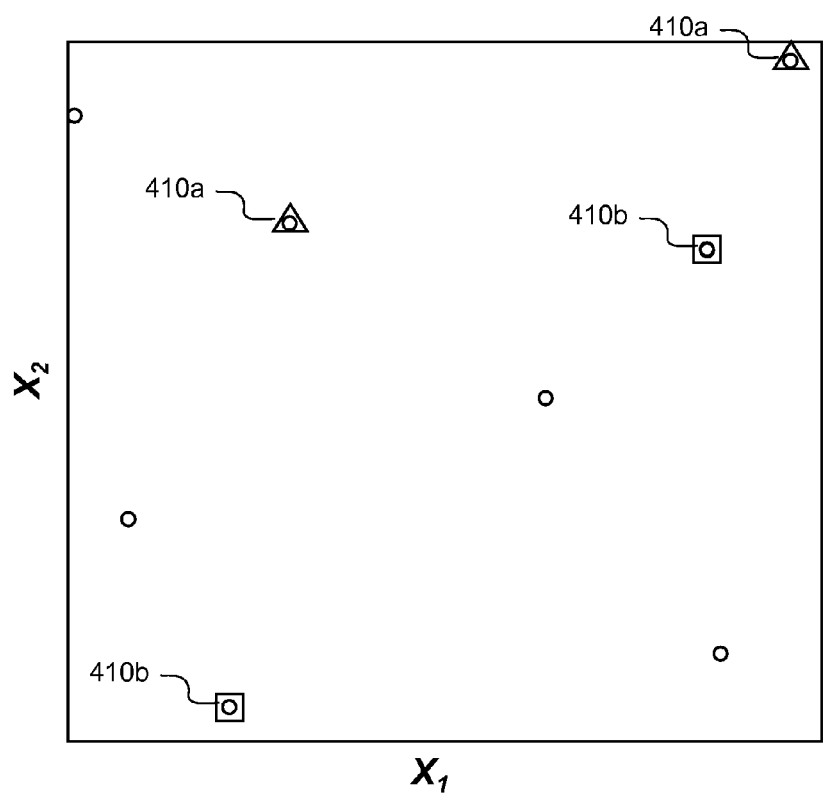
FIG. 4 is a two-dimensional diagram illustrating a set of DOE samples used in a cross-validation procedure, according to an embodiment of the present invention.

Best metamodel parameter set for the second metamodel can be selected with a technique referred to as cross-validation (CV), which is described as follows: a) partitioning the DOE samples into K groups without any overlapped DOE sample; b) evaluating error of one of the N trial sets by comparing the approximated responses with the known responses, whereby the numerically-simulated or known responses are said training's target; and c) repeating said evaluating error step for remaining of the N trial sets for said one of the K groups and then repeating for each of the N trial sets for all of the remaining ones among the K groups. The set having the minimum error is selected as the best. The final second metamodel is constructed with this best set of metamodel parameters using all the samples. N and K are strictly positive integers. FIG. 4 shows exemplary subsets of DOE points illustrated as different symbols 410a-410b.

Two examples used for comparison of the present invention and a prior art approach are listed below. To quantify the errors, the sum of square error of a grid of validation samples is used. The value of the error is scaled by the sum of square value of the responses, resulting in values representative of the relative error.

$$\text{Error} = \frac{1}{N_{repeat}} \sum_{j=1}^{N_{repeat}} \frac{\sum_{i=1}^{N_{test}} (f(x_i) - y_i)^2}{\sum_{i=1}^{N_{test}} y_i^2} \quad (9)$$

where $y_i$ is actual response at the $i^{th}$ test point.

$f(x_i)$ is approximated response at the $i^{th}$ test point.

$N_{test}$ is the number of the uniformly distributed test points to calculate Error.

$N_{repeat}$ is the number of distinct sets of tests points to calculate Error.

EXAMPLE 1

Branin-Hoo Function $$f(x_1, x_2) = \left(x_2 - \frac{5}{4\pi^2}x_1^2 + \frac{5}{\pi}x_1 - 6\right)^2 + 10\left(1 - \frac{1}{8\pi}\right)\cos(x_1) + 10$$

$x_1 \in [-5, 10]$ $x_2 \in [0, 15]$

EXAMPLE 2

Two-Bar Truss

Figure 5:
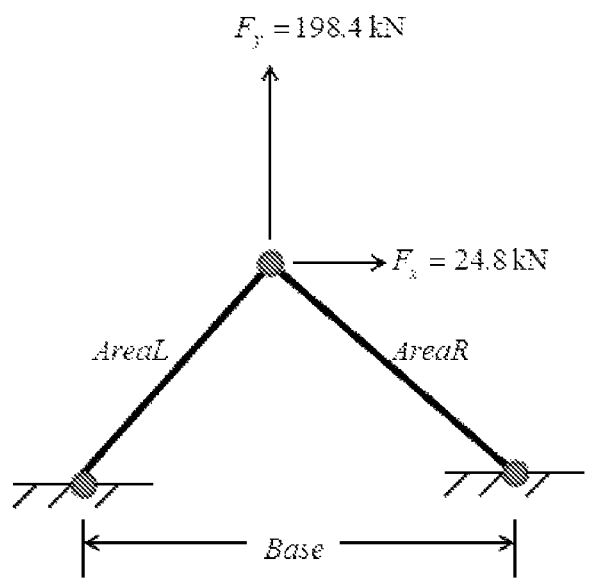
FIG. 5 is a diagram showing a two-bar truss example used as an example for a comparison.

The structure considered is a two-bar truss shown in FIG. 5. It has two independent variables—the area of cross section of the left truss member, and the separation between the supports. The responses to be approximated are the stresses in the left and right members (StressL and StressR). The variable bounds are given below.

Figure 1:
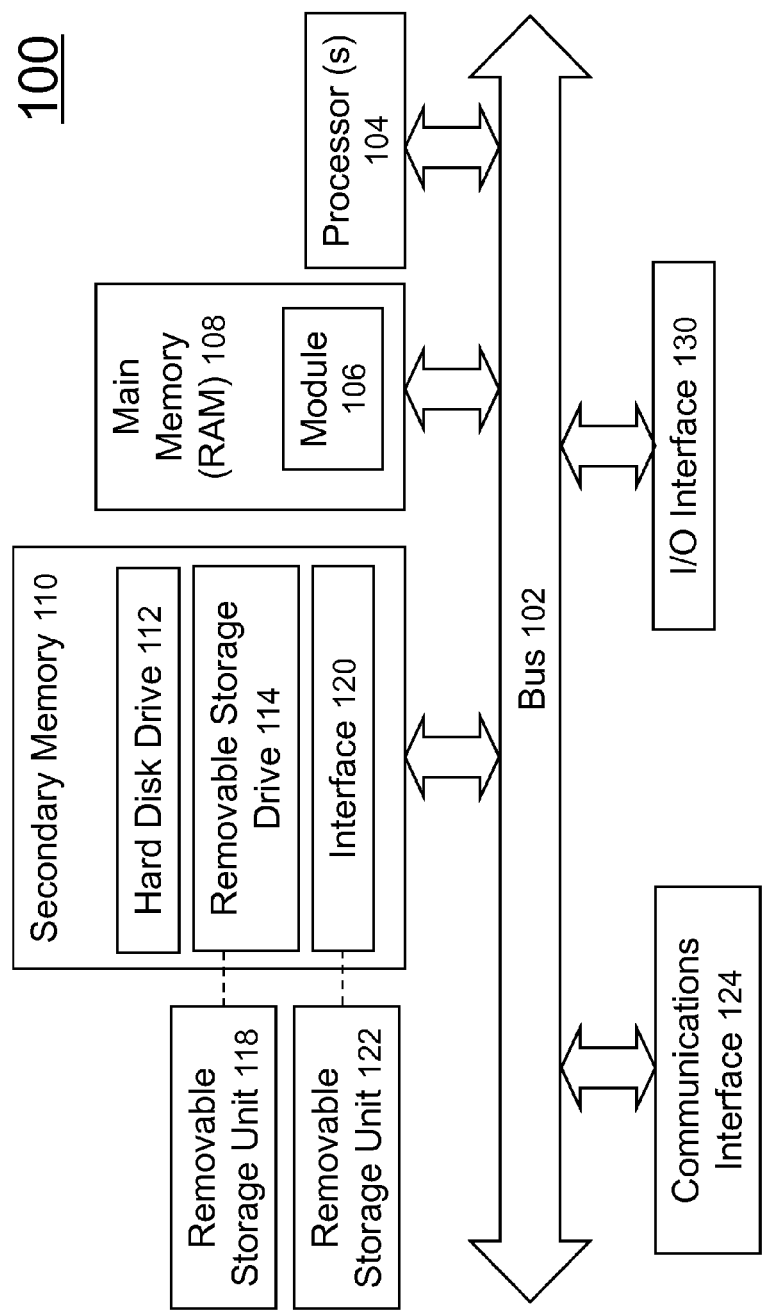
FIG. 1 is a function diagram showing salient components of a computing system, in which an embodiment of the present invention may be implemented.

$\text{Base} \in [0.1, 1.6]$ $\text{AreaL} \in [0.2, 4]$ $\text{AreaR} = \frac{\text{AreaL}}{2}$ According to one aspect, the present invention is directed towards one or more computer systems capable of carrying out the functionality described herein. An example of a computer system 100 is shown in FIG. 1. The computer system 100 includes one or more processors, such as processor 104. The processor 104 is connected to a computer system internal communication bus 102. Various software embodiments are described in terms of this exemplary computer system. After reading this description, it will become apparent to a person skilled in the relevant art(s) how to implement the invention using other computer systems and/or computer architectures.

Computer system 100 also includes a main memory 108, preferably random access memory (RAM), and may also include a secondary memory 110. The secondary memory 110 may include, for example, one or more hard disk drives 112 and/or one or more removable storage drives 114, representing a floppy disk drive, a magnetic tape drive, an optical disk drive, etc. The removable storage drive 114 reads from and/or writes to a removable storage unit 118 in a well-known manner. Removable storage unit 118, represents a floppy disk, magnetic tape, optical disk, etc. which is read by and written to by removable storage drive 114. As will be appreciated, the removable storage unit 118 includes a computer usable storage medium having stored therein computer software and/or data.

In alternative embodiments, secondary memory 110 may include other similar means for allowing computer programs or other instructions to be loaded into computer system 100. Such means may include, for example, a removable storage unit 122 and an interface 120. Examples of such may include a program cartridge and cartridge interface (such as that found in video game devices), a removable memory chip (such as an Erasable Programmable Read-Only Memory (EPROM), Universal Serial Bus (USB) flash memory, or PROM) and associated socket, and other removable storage units 122 and interfaces 120 which allow software and data to be transferred from the removable storage unit 122 to computer system 100. In general, Computer system 100 is controlled and coordinated by operating system (OS) software, which performs tasks such as process scheduling, memory management, networking and I/O services.

There may also be a communications interface 124 connecting to the bus 102. Communications interface 124 allows software and data to be transferred between computer system 100 and external devices. Examples of communications interface 124 may include a modem, a network interface (such as an Ethernet card), a communications port, a Personal Computer Memory Card International Association (PCMCIA)

slot and card, etc. The computer 100 communicates with other computing devices over a data network based on a special set of rules (i.e., a protocol). One of the common protocols is TCP/IP (Transmission Control Protocol/Internet Protocol) commonly used in the Internet. In general, the communication interface 124 manages the assembling of a data file into smaller packets that are transmitted over the data network or reassembles received packets into the original data file. In addition, the communication interface 124 handles the address part of each packet so that it gets to the right destination or intercepts packets destined for the computer 100. In this document, the terms "computer program medium" and "computer usable medium" are used to generally refer to media such as removable storage drive 114, and/or a hard disk installed in hard disk drive 112. These computer program products are means for providing software to computer system 100. The invention is directed to such computer program products.

The computer system 100 may also include an input/output (I/O) interface 130, which provides the computer system 100 to access monitor, keyboard, mouse, printer, scanner, plotter, and alike.

Computer programs (also called computer control logic) are stored as application modules 106 in main memory 108 and/or secondary memory 110. Computer programs may also be received via communications interface 124. Such computer programs, when executed, enable the computer system 100 to perform the features of the present invention as discussed herein. In particular, the computer programs, when executed, enable the processor 104 to perform features of the present invention. Accordingly, such computer programs represent controllers of the computer system 100.

In an embodiment where the invention is implemented using software, the software may be stored in a computer program product and loaded into computer system 100 using removable storage drive 114, hard drive 112, or communications interface 124. The application module 106, when executed by the processor 104, causes the processor 104 to perform the functions of the invention as described herein.

The main memory 108 may be loaded with one or more application modules 106 that can be executed by one or more processors 104 with or without a user input through the I/O interface 130 to achieve desired tasks. In operation, when at least one processor 104 executes one of the application modules 106, the results are computed and stored in the secondary memory 110 (i.e., hard disk drive 112). The status of the CAE analysis or design optimization (e.g., simulated responses, approximated responses, kernel width parameters obtained from the first metamodel) is reported to the user via the I/O interface 130 either in a text or in a graphical representation.

Although the present invention has been described with reference to specific embodiments thereof, these embodiments are merely illustrative, and not restrictive of, the present invention. Various modifications or changes to the specifically disclosed exemplary embodiments will be suggested to persons skilled in the art. For example, whereas the number of design variables has been shown as two, in reality, a larger number of design variables have been used. Additionally, relatively few DOE samples have been shown and described, other number of DOE samples can accomplish the same. The present invention does not set a limit to the number of DOE samples. Furthermore, whereas finite element analysis has been described and shown, other types of CAE analysis such as finite difference analysis or meshless analysis, etc. may be used to achieve the same. In summary, the scope of the invention should not be restricted to the specific exemplary embodiments disclosed herein, and all modifications that are readily suggested to those of ordinary skill in the art should be included within the spirit and purview of this application and scope of the appended claims.

I claim:

1. A method used in conducting an engineering design optimization of a product using multiple metamodels, said method comprising:
    receiving a set of design variables, objectives and constraints for designing and optimizing a product in a computer system having an engineering design optimization application module installed thereon;
    choosing a plurality of design of experiments (DOE) samples in a design space defined by the design variables, said each DOE sample corresponding to a unique combination of the design variables;
    obtaining respective numerically-simulated responses of the DOE samples by conducting a computer aided engineering analysis of each of the DOE samples;
    selecting first and second metamodels for approximating responses in the design space, the first metamodel and the second metamodel having a common correlation function with a set of kernel width parameters being determined in the first metamodel as a result and defined a priori in the second metamodel;
    obtaining a plurality sets of kernel width parameter values in a first stage of a metamodel training procedure by fitting the obtained numerically-simulated responses into the first metamodel with one or more prediction trends;
    deriving additional set of kernel width parameter values by algebraically combining said plurality sets of kernel width parameter values;
    determining a minimum error set of metamodel parameter values to be used in a trained second metamodel in a second stage of the metamodel training procedure from N trial sets of metemodel parameter values that includes said plurality sets and said additional set of kernel width parameter values obtained in the first stage along with various combinations of other parameters of the second metamodel, the minimum error set being the set having minimum error in a cross-validation procedure using the obtained numerically-simulated responses, wherein N is a positive integer; and
    obtaining one or more optimized designs of the product based on the set of design variables, objectives and constraints using approximated responses from the trained second metamodel.

2. The method of claim 1, wherein said obtaining the set of kernel width parameters further comprises obtaining an optional one of the set of kernel width parameters by assuming an isotropic kernel function in the second metamodel.

3. The method of claim 1, wherein said cross-validation procedure further comprising:
    partitioning the DOE samples into K groups without any overlapped DOE sample in each group, where K is a positive integer;
    evaluating error of one of the N trial sets by comparing approximated responses with the numerically-simulated responses in one of the K groups; and
    repeating said evaluating error step for remaining of the N trial sets for said one of the K groups and then repeating the N trial sets for other ones of the K groups.

4. The method of claim 1, wherein the first metamodel comprises Kriging model.

5. The method of claim 4, wherein said prediction trends includes constant, linear, quadratic.

6. The method of claim 1, wherein the second metamodel comprises support vector regression.

7. The method of claim 1, wherein the second metamodel comprises radial basis function networks.

8. A system for conducting an engineering design optimization of a product using multiple metamodels, said system comprising;
an input/output (I/O) interface;
a memory for storing computer readable code for an engineering design optimization application module;
at least one processor coupled to the memory, said at least one processor executing the computer readable code in the memory to cause the engineering design optimization application module to perform operations of:
receiving a set of design variables, objectives and constraints for designing and optimizing a product;
choosing a plurality of design of experiments (DOE) samples in a design space defined by the design variables, said each DOE sample corresponding to a unique combination of the design variables;
obtaining respective numerically-simulated responses of the DOE samples by conducting a computer aided engineering analysis of each of the DOE samples;
selecting first and second metamodels for approximating responses in the design space, the first metamodel and the second metamodel having a common correlation function with a set of kernel width parameters being determined in the first metamodel as a result and defined a priori in the second metamodel;
obtaining a plurality sets of kernel width parameter values in a first stage of a metamodel training procedure by fitting the obtained numerically-simulated responses into the first metamodel with one or more prediction trends;
deriving additional set of kernel width parameter values by algebraically combining said plurality sets of kernel width parameter values;
determining a minimum error set of metamodel parameter values to be used in a trained second metamodel in a second stage of the metamodel training procedure from N trial sets of metemodel parameter values that includes said plurality sets and said additional set of kernel width parameter values obtained in the first stage along with various combinations of other parameters of the second metamodel, the minimum error set being the set having minimum error in a cross-validation procedure using the obtained numerically-simulated responses, wherein N is a positive integer; and
obtaining one or more optimized designs of the product based on the set of design variables, objectives and constraints using approximated responses from the trained second metamodel.

9. The system of claim 8, wherein said obtaining the set of kernel width parameters further comprises obtaining an optional one of the set of kernel width parameters by assuming an isotropic kernel function in the second metamodel.

10. The system of claim 8, wherein said cross-validation procedure further comprising:
partitioning the DOE samples into K groups without any overlapped DOE sample in each group, where K is a positive integer;
evaluating error of one of the N trial sets by comparing approximated responses with the numerically-simulated responses in one of the K groups; and repeating said evaluating error step for remaining of the N trial sets for said one of the K groups and then repeating the N trial sets for other ones of the K groups.

11. A non-transitory computer readable storage medium containing instructions, when executed in a computer system, for conducting an engineering design optimization of a product using multiple metamodels by a method comprising:
receiving a set of design variables, objectives and constraints for designing and optimizing a product in a computer system having an engineering design optimization application module installed thereon;
choosing a plurality of design of experiments (DOE) samples in a design space defined by the design variables, said each DOE sample corresponding to a unique combination of the design variables;
obtaining respective numerically-simulated responses of the DOE samples by conducting a computer aided engineering analysis of each of the DOE samples;
selecting first and second metamodels for approximating responses in the design space, the first metamodel and the second metamodel having a common correlation function with a set of kernel width parameters being determined in the first metamodel as a result and defined a priori in the second metamodel;
obtaining a plurality sets of kernel width parameter values in a first stage of a metamodel training procedure by fitting the obtained numerically-simulated responses into the first metamodel with one or more prediction trends;
deriving additional set of kernel width parameter values by algebraically combining said plurality sets of kernel width parameter values;
determining a minimum error set of metamodel parameter values to be used in a trained second metamodel in a second stage of the metamodel training procedure from N trial sets of metemodel parameter values that includes said plurality sets and said additional set of kernel width parameter values obtained in the first stage along with various combinations of other parameters of the second metamodel, the minimum error set being the set having minimum error in a cross-validation procedure using the obtained numerically-simulated responses, wherein N is a positive integer; and
obtaining one or more optimized designs of the product based on the set of design variables, objectives and constraints using approximated responses from the trained second metamodel.

12. The non-transitory computer readable storage medium of claim 11, wherein said obtaining the set of kernel width parameters further comprises obtaining an optional one of the set of kernel width parameters by assuming an isotropic kernel function in the second metamodel.

13. The non-transitory computer readable storage medium of claim 11, wherein said cross-training procedure further comprising:
partitioning the DOE samples into K groups without any overlapped DOE sample in each group, where K is a positive integer;
evaluating error of one of the N trial sets by comparing approximated responses with the numerically-simulated responses in one of the K groups; and
repeating said evaluating error step for remaining of the N trial sets for said one of the K groups and then repeating the N trial sets for other ones of the K groups.

* * * * *